(12) United States Patent
Park et al.

(10) Patent No.: US 11,264,531 B2
(45) Date of Patent: Mar. 1, 2022

(54) LED TRANSFER DEVICE AND MICRO LED TRANSFERRING METHOD USING THE SAME

(71) Applicant: SAMSUNG ELECTRONICS CO., LTD., Suwon-si (KR)

(72) Inventors: Sangmoo Park, Suwon-si (KR); Doyoung Kwag, Suwon-si (KR); Eunhye Kim, Suwon-si (KR); Minsub Oh, Seoul (KR); Yoonsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 42 days.

(21) Appl. No.: 16/688,577

(22) Filed: Nov. 19, 2019

(65) Prior Publication Data
US 2020/0203557 A1 Jun. 25, 2020

(30) Foreign Application Priority Data
Nov. 20, 2018 (KR) .................. 10-2018-0143825

(51) Int. Cl.
*H01L 21/683* (2006.01)
*H01L 33/00* (2010.01)
(Continued)

(52) U.S. Cl.
CPC ...... *H01L 33/0093* (2020.05); *B81C 1/00865* (2013.01); *H01L 21/6835* (2013.01);
(Continued)

(58) Field of Classification Search
CPC . H01L 33/0093; H01L 21/6835; H01L 22/20; H01L 25/0753; H01L 2221/68368;
(Continued)

(56) References Cited

U.S. PATENT DOCUMENTS 6,559,905 B1 5/2003 Akiyama
6,806,918 B2 10/2004 Akiyama
(Continued)

FOREIGN PATENT DOCUMENTS

GB 2544335 A 5/2017
JP 2001007340 A 1/2001
(Continued)

OTHER PUBLICATIONS

International Search Report (PCT/ISA/210) dated Feb. 17, 2020 issued by the International Searching Authority in counterpart International Application No. PCT/KR2019/015064.
(Continued)

*Primary Examiner* — Vu A Vu
(74) *Attorney, Agent, or Firm* — Sughrue Mion, PLLC

(57) ABSTRACT

A micro light emitting diode (LED) transfer device includes a transfer part configured to transfer a plurality of LEDs arranged on a first substrate to a relay substrate; a memory configured to store characteristic information of each of the plurality of LEDs; and a processor configured to determine arrangement locations of each of the plurality of LEDs on the relay substrate based on the stored characteristic information, and control the transfer part to transfer the plurality of LEDs to the determined arrangement locations.

10 Claims, 17 Drawing Sheets

(51) Int. Cl.
*H01L 21/66* (2006.01)
*H01L 25/075* (2006.01)
*B81C 1/00* (2006.01)

(52) U.S. Cl.
CPC .......... *H01L 22/20* (2013.01); *H01L 25/0753* (2013.01); *H01L 2221/68368* (2013.01)

(58) Field of Classification Search
CPC ..... H01L 25/075; H01L 21/677; H01L 21/67; H01L 33/00; B81C 1/00865
USPC ............................................ 156/942; 438/15
See application file for complete search history.

(56) References Cited

U.S. PATENT DOCUMENTS

| | | | |
|---|---|---|---|
| 7,050,125 B2 | 5/2006 | Akiyama | |
| 8,101,457 B2 | 1/2012 | Tomoda et al. | |
| 9,373,274 B2 | 6/2016 | Okuyama | |
| 9,786,638 B2 | 10/2017 | Okuyama | |
| 10,096,740 B1 | 10/2018 | Chen | |
| 2003/0094619 A1 | 5/2003 | Akiyama | |
| 2004/0114061 A1 | 6/2004 | Kimura et al. | |
| 2004/0201789 A1 | 10/2004 | Akiyama | |
| 2009/0290337 A1 | 11/2009 | Tomoda et al. | |
| 2017/0179097 A1 | 6/2017 | Zhang et al. | |
| 2017/0358478 A1 | 12/2017 | Thothadri et al. | |
| 2018/0138357 A1* | 5/2018 | Henley | H01L 33/0095 |
| 2018/0226376 A1 | 8/2018 | Huska et al. | |
| 2019/0221466 A1* | 7/2019 | Arai | H01L 25/0753 |
| 2020/0006108 A1* | 1/2020 | Brodoceanu | H01L 21/67069 |

FOREIGN PATENT DOCUMENTS

| | | |
|---|---|---|
| JP | 4979989 B2 | 7/2012 |
| JP | 5135865 B2 | 2/2013 |
| JP | 5196262 B2 | 5/2013 |
| KR | 100772567 B1 | 11/2007 |
| KR | 20090031411 A | 3/2009 |
| KR | 10-2016-0006790 A | 1/2016 |

OTHER PUBLICATIONS

Written Opinion (PCT/ISA/237) dated Feb. 17, 2020 issued by the International Searching Authority in counterpart International Application No. PCT/KR2019/015064.
Communication dated Jul. 13, 2021, issued by the European Patent Office in European Application No. 19888152.6.

* cited by examiner

LED TRANSFER DEVICE AND MICRO LED TRANSFERRING METHOD USING THE SAME

CROSS-REFERENCE TO RELATED APPLICATION(S)

This application is based on and claims priority under 35 U.S.C. § 119 to Korean Patent Application No. 10-2018-0143825, filed on Nov. 20, 2018, in the Korean Intellectual Property Office, the disclosure of which is incorporated by reference herein in its entirety.

BACKGROUND

1. Field

The disclosure relates to a micro LED transfer device with improved transferring efficiency of micro LEDs and a micro LED transferring method using the same.

2. Description of Related Art

A micro light emitting diode (LED) is a micro-sized inorganic light emitting material which emits light without a color filter and a backlight. Specifically, a micro LED may refer to a micro-sized LED which has a 1/10 length or a 1/100 area of a general LED, and of which width, length, and height are in sizes of 10~100 micrometers (μm).

A micro LED may constitute a light emitting module of a display and may be manufactured in the form of a chip on a wafer, in which the micro LED may be arranged on a target substrate.

However, a semiconductor chip on a wafer is manufactured such that performances of micro LEDs may differ in color and brightness due to manufacture tolerance in a manufacturing process, and the differences in performances between each area of a semiconductor chip on a wafer occur.

Accordingly, as a semiconductor chip on a wafer is arranged on a target substrate, when the performances of each area of the semiconductor chip on a wafer are different from one another, performances may differ between each area of a target substrate.

Such differences in performances between each area of a semiconductor chip on a target substrate may cause the luminance or color of a manufactured display to be not uniform.

Also, when a micro LED on a wafer is transferred to a target substrate directly, there may be problems that, due to repetitive transferring processes onto the target substrate, the target substrate may be damaged, or due to contacts with the micro LED which have been already transferred, the stability of the transferring operation of the micro LED may deteriorate.

SUMMARY

Provided are an LED transfer device with improved transferring efficiency of LEDs and an LED transferring method using the same.

In accordance with an aspect of the disclosure, there is provided a light emitting diode (LED) transfer device that may include a transfer part configured to transfer a plurality of LEDs arranged on a first substrate to a relay substrate; a memory configured to store characteristic information of each of the plurality of LEDs; and a processor configured to determine arrangement locations of each of the plurality of LEDs on the relay substrate based on the stored characteristic information, and control the transfer part to transfer the plurality of LEDs to the determined arrangement locations.

The relay substrate may have a size that is different from a size of the first substrate.

The plurality of LEDs may be arranged in a pattern on the relay substrate.

The plurality of LEDs may include a first LED emitting red light, a second LED emitting green light, and a third LED emitting blue light, and the first LED, the second LED, and the third LED may be sequentially arranged on the relay substrate.

The processor is further configured to divide the relay substrate into a plurality of second areas, and determine the arrangement locations of each of the plurality of LEDs on the relay substrate based on output characteristics of the plurality of second areas.

The processor is further configured to divide the first substrate a plurality of first areas, determine the arrangement locations of each of the plurality of LEDs such that the output characteristics of the plurality of second areas are uniform, and arrange the plurality of LEDs in different first areas of the first substrate into one of the plurality of second areas of the relay substrate.

The processor is further configured to control the transfer part so that the plurality of LEDs in different first areas of the first substrate are alternatively arranged in the one of the plurality of second areas of the relay substrate.

The transfer part is configured to simultaneously collect the plurality of LEDs on the first substrate and arrange the collected plurality of LEDs on the relay substrate, and the processor is further configured to control the transfer part so that the plurality of LEDs spaced apart from one another on the first substrate are simultaneously collected.

The transfer part may include a mask device having openings formed in locations corresponding to the determined arrangement locations of the plurality of LEDs on the first substrate, and the processor may be further configured to control a light source to irradiate laser light on the mask device and control the mask device to transfer the plurality of LEDs on the relay substrate.

The characteristic information may be at least one of output wavelengths, luminance, and performance levels of the plurality of LEDs.

The relay substrate may be provided on a stage and may be moveable in a horizontal direction.

In accordance with an aspect of the disclosure, there is provided a light emitting diode (LED) transferring method that may include storing characteristic information of a plurality of LEDs arranged on a first substrate; determining arrangement locations of each of the plurality of LEDs on a relay substrate based on the stored characteristic information; transferring the plurality of LEDs on the relay substrate according to the determined arrangement locations; and identifying performances of the plurality of LEDs arranged on the relay substrate.

The method may further include determining locations of the plurality of LEDs having lower performances than a predetermined value; removing the plurality of LEDs having lower performances than the predetermined value; and arranging new LEDs in the locations of the removed plurality of LEDs.

The determining may further include dividing the relay substrate into a plurality of second areas, and determining the arrangement locations of each of the plurality of LEDs based on output characteristics of the plurality of second areas.

The determining may further include dividing the first substrate into a plurality of first areas, determining the arrangement locations of each of the plurality of LEDs such that the output characteristics of the plurality of second areas of the relay substrate are uniform, and arranging the plurality of LEDs in different first areas of the first substrate into one of the plurality of second areas of the relay substrate.

The transferring may further include transferring the plurality of LEDs in different first areas of the first substrate to be arranged alternatively in the one of the plurality of second areas of the relay substrate.

The transferring may further include simultaneously collecting the plurality of LEDs on the first substrate and controlling such that a plurality of LEDs spaced apart from one another among the plurality of LEDs arranged on the first substrate are simultaneously collected.

The transferring may further include irradiating laser light on a mask device, in which the mask device includes openings formed in locations corresponding to the determined arrangement locations of the plurality of LEDs on the first substrate.

The method may further include transferring the plurality of LEDs arranged on the relay substrate to a target substrate.

In accordance with an aspect of the disclosure, there is provided a non-transitory computer-readable recording medium including a program for executing a light emitting diode (LED) transferring method. The LED transferring method may include storing characteristic information of a plurality of LEDs arranged on a first substrate; determining arrangement locations of each of the plurality of LEDs on a relay substrate based on the stored characteristic information; and identifying performances of the plurality of LEDs transferred on the relay substrate according to the determined arrangement locations.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The disclosure will be described with reference to the accompanying drawings, for comprehensive understanding of embodiments herein. Meanwhile, it should be noted that the disclosure is not limited to the embodiments described herein, but may be implemented in various forms, and various modifications may be made to the embodiments. The descriptions of the embodiments are provided to help those ordinary skilled in the art in the technical field, to which the disclosure belongs, to understand the range of the disclosure. In the accompanying drawings, components are illustrated in enlarged sizes than their actual sizes for the convenience of description, and the proportion of each component may be exaggerated or reduced.

Also, in case it is described that a component is "on top of" or "in contact with" another component, it may be understood that a first component may be in direct contact or connected with the top portion of a second component, but a third component may exist between the first component and the second component.

Further, terms such as "first," "second" and the like may be used to describe various elements, but the elements are not intended to be limited by the terms. Such terms may be used only for distinguishing one element from another element.

Singular expressions may include plural expressions, unless defined otherwise in the context. Also, it may be understood that the terms such as "include" or "have" may be construed as specifying the presence of characteristics, numbers, steps, operations, elements, components or a combination thereof, but do not preclude one or more of other characteristics, numbers, steps, operations, elements, components and/or a combination thereof.

The terms used in the embodiments herein may be interpreted to mean those terms generally known to one of ordinary skill in the art, unless defined otherwise.

The display module according to an embodiment of the disclosure may be applied to an electronic product or an electronic device that requires a wearable device, a portable device, a handheld device, or various displays, in a single unit. The display module can also be applied to a small display device such as a monitor for a personal computer, a TV, etc. and a large display device such as a digital signage, an electronic display through a plurality of assembly arrangements.

According to an embodiment, the configuration of the micro LED transfer device 1 will be described with reference to FIGS. 1, 2, and 3.

Figure 1:
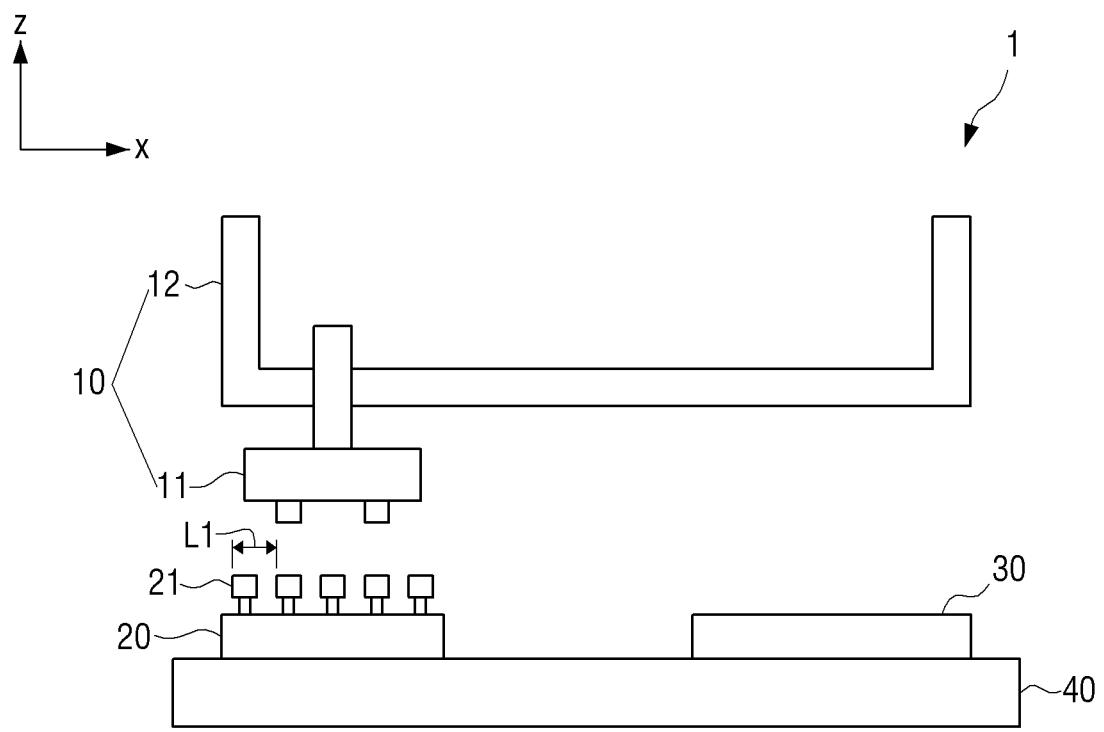
FIG. 1 is a schematic diagram illustrating a micro LED transfer device according to an embodiment.

FIG. 1 is a schematic diagram illustrating a micro LED transfer device 1 according to an embodiment. FIG. 2 is a schematic diagram illustrating a transfer part 11' according to an embodiment.

As illustrated in FIG. 1, the micro LED transfer device 1 may include a transfer part 10 configured to transfer a plurality of micro LEDs 21 arranged on a first substrate 20 to a relay substrate 30 having a size different from the first substrate 20. The micro LED transfer device 1 may include a memory 50 configured to store characteristic information of each of the plurality of micro LEDs 21, and a processor 60 configured to determine the arrangement locations of each of the plurality of LEDs 21 on the relay substrate 30 based on the stored characteristic information, and control the transfer part 10 such that the plurality of micro LEDs 21 are transferred to the determined arrangement locations.

The transfer part 10 may include a transcription part 11 configured to pick up the plurality of micro LEDs 21 arranged on the first substrate 20 and a moving part 12 that is connected with the transcription part 11, and may move the transcription part 11 to the first substrate 20 or to the relay substrate 30.

In addition, the transfer part 10 may not only move in up, down, left, and right directions along a spatial coordinate system (X, Y, and Z axes) on the first substrate 20 and the relay substrate 30, but may also rotate with the X, Y, and Z axes as the center.

Figure 5:
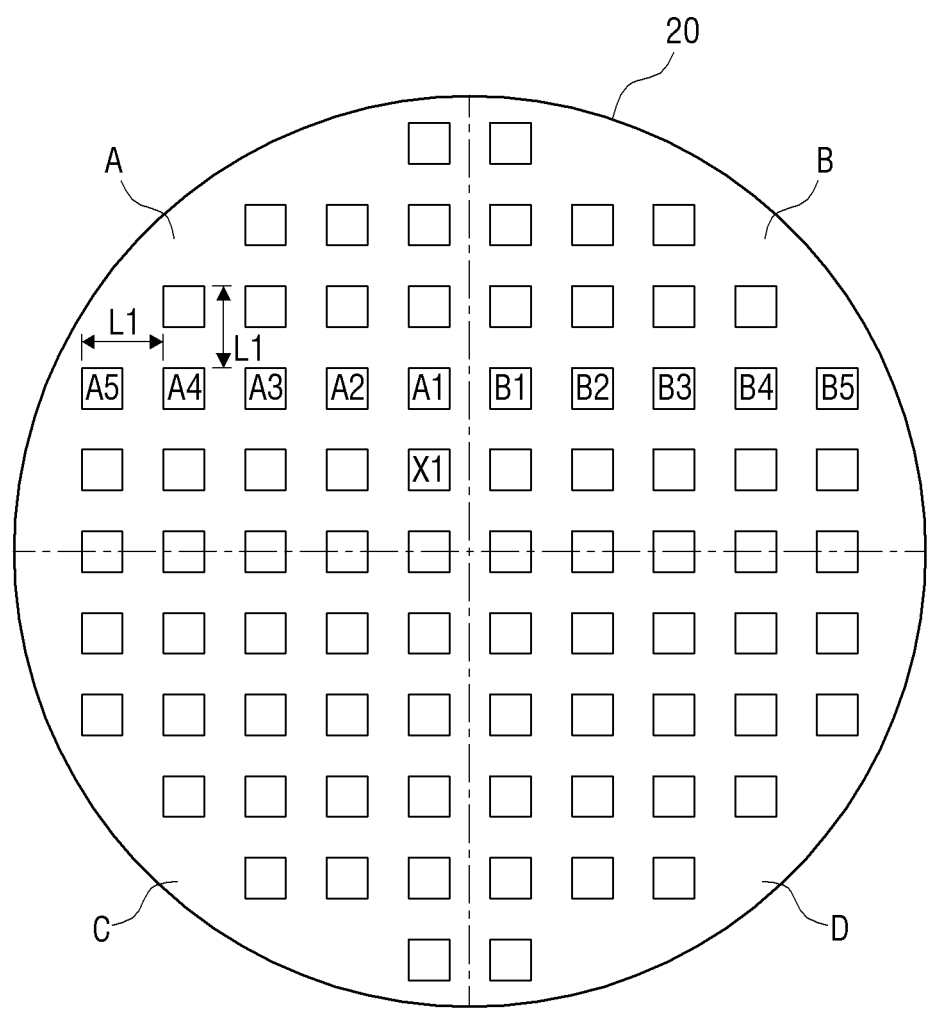
FIG. 5 is a top surface view of a first substrate in a state in which characteristic information of a plurality of micro LEDs has been input according to an embodiment.

For example, referring to FIG. 5, the transfer part 10 may move from a location where it picks up an A1-micro LED to a location where an X1-micro LED is placed to be spaced apart in the Y axis direction.

The transcription part 11 is a device that arranges the plurality of micro LEDs 21 on the first substrate 20 and on the relay substrate 30, and may use various methods such as a stamp method and a laser lift-off method.

For example, as illustrated in FIG. 1, in case the transcription part 11 uses a pick-up method, the transcription part 11 may selectively or integrally pick up the plurality of micro LEDs 21 arranged on the first substrate 20, and depending on needs, may pick up the plurality of micro LEDs 21 by various methods such as an adhesive method, a vacuum method, an electrostatic method, a hybrid method, and etc., and transfer the LEDs.

Here, the plurality of micro LEDs 21 may be arranged on the first substrate 20 to be picked-up by the transcription part 11. In this case, the first substrate 20 may be a wafer or a relay substrate.

Accordingly, the transcription part 11 may pick up the plurality of micro LEDs 21 arranged on the top surface of the first substrate 20, and transfer them to the relay substrate 30.

In addition, the transcription part 11 may be formed in various structures and is not limited to the structure shown in FIG. 1.

Figure 2:
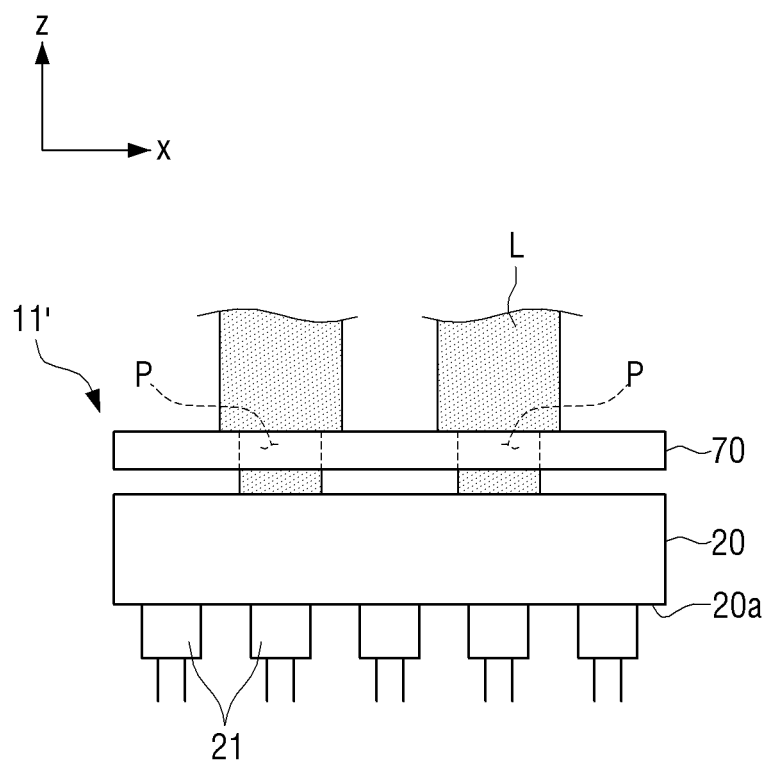
FIG. 2 is a schematic diagram illustrating a transfer part of a micro LED transfer device according to an embodiment.

In addition, the transcription part 11 may use a laser lift-off method, as illustrated in FIG. 2. The transcription part 11' may include a mask device 70 that is arranged on the first substrate 20 and may pass a laser light L through the first substrate 20.

Here, the plurality of micro LEDs 21 may be arranged on the lower surface 20a of the first substrate 20, and the first substrate 20 may be a wafer or a relay substrate.

The mask device 70 may include a plurality of patterned openings Pin locations corresponding to the plurality of micro LEDs 21 to be dropped on the first substrate 20.

Accordingly, while the mask device 70 is arranged on the first substrate 20, laser light L may be irradiated on the mask device 70, and the laser light L that passed through the mask device 70 may drop the plurality of selected micro LEDs 21 from the first substrate 20 to the relay substrate 30, and thereby transferring the plurality of micro LEDs 21.

The pattern of the plurality of openings P may include different patterns as long as they can make laser light L pass through, and drop the plurality of micro LEDs 21.

For example, the plurality of openings P may be formed on the mask device 70 at a first interval L1. Here, the first interval L1 may be set in consideration of the intervals among the plurality of micro LEDs 21 on the first substrate 20.

For example, in case the plurality of micro LEDs 21 on the first substrate 20 are to be arranged at a first interval L1, the plurality of openings P may be formed at the first interval L1 so as to be formed in locations corresponding to each of the plurality of micro LEDs 21.

Accordingly, the first interval L1 may vary according to users' settings. For example, the first interval L1 may be from several micrometers to several nanometers.

As described above, the transcription part 11 may use various methods, such that the plurality of micro LEDs 21 on the first substrate 20 may be transferred to the relay substrate 30.

Referring back to FIG. 1, the moving part 12 may be a structure configured to support the transcription part 11 for moving the transcription part 11, and may be coupled with another structure. Also, the moving part 12 may move the transcription part 11 through various structures such as a multi-joint structure, a piston structure, a sliding structure, and etc. The moving part 12 may move in a state of being connected with the transcription part 11.

The first substrate 20 may be a wafer. On the first substrate 20, a plurality of micro LEDs 21 deposited on various substrates, for example, a sapphire substrate, may be arranged. In addition, the first substrate 20 may be a relay substrate depending according to an embodiment.

Also, the plurality of micro LEDs 21 may be arranged on the top surface or the lower surface of the first substrate 20.

The micro LED 21 may include an inorganic light emitting material of which width, length, and height are in sizes equal to or smaller than 100 μm, and may irradiate light when power is supplied.

Here, the micro LED 21 has a fast reaction speed, low power consumption, and high luminance, and thus, the micro LEDs are gaining popularity as a light emitting diode for the next generation displays. Specifically, the micro LED 21 has higher efficiency in converting electricity into photodiodes compared to conventional LCDs or OLEDs.

That is, the micro LED 21 has higher "brightness per watt" compared to conventional LCDs or OLED displays. Accordingly, the micro LED 21 may output the same brightness with only one-half of energy that is required to output the same brightness in the conventional LEDs or OLEDs.

As such, the micro LED 21 may implement a high resolution, excellent colors, contrast, and brightness, and express colors in a wide range precisely, and implement a clear screen even in outdoors with a bright sunlight. Also, the micro LED 21 may solve the problem of burn in phenomenon because less amount of heat is generated, and accordingly, a long lifespan may be guaranteed without deformation.

In addition, the micro LED 21 may be a red micro LED emitting red light, a green micro LED emitting green light, or a blue micro LED emitting blue light.

For example, on one wafer, one type of micro LED which emits a single color may be arranged.

In addition, in case the first substrate 20 is a wafer, on the first substrate 20, only a red micro LED emitting red light, a green micro LED emitting green light, or a blue micro LED emitting blue light may be arranged.

Furthermore, in case the first substrate 20 is a relay substrate, on the first substrate 20, a red micro LED, a green micro LED, and a blue micro LED may be arranged in combination.

For example, on the first substrate 20, a red micro LED, a green micro LED, and a blue micro LED may be arranged to constitute one pixel.

On the relay substrate 30, the plurality of micro LEDs 21 may be transferred, and the relay substrate 30 may be physically and electronically connected with the plurality of micro LEDs 21.

In addition, the relay substrate 30 may have a bigger size than the first substrate 20. Accordingly, not only the plurality of micro LEDs 21 arranged on one first substrate 20 is transferred, but also the plurality of micro LEDs arranged on a plurality of substrates may be transferred onto one relay substrate 30.

That is, while the relay substrate 30 having a bigger size than the first substrate 20 may transfer the plurality of micro LEDs 21 at once to a target substrate 80 (refer to FIG. 11A), in case the plurality of micro LEDs 21 are directly transferred from the first substrate 20 to the target substrate 80, the transfer may need to be performed several times due to the difference in sizes.

Accordingly, damage may occur to the target substrate including sensitive electronic elements, such as a thin film transistor.

Thus, in case the plurality of micro LEDs 21 are transferred by using the relay substrate 30 according to an embodiment, the transfer speed and efficiency may be improved, and stability and reliability of transfer may also be improved.

In addition, the size of the relay substrate 30 may be identical to the size of the target substrate 80. In such case, as the plurality of micro LEDs 21 arranged on the relay substrate 30 are transferred onto the target substrate 80 at once, transfer speed and transfer efficiency may be improved.

Figure 6A:
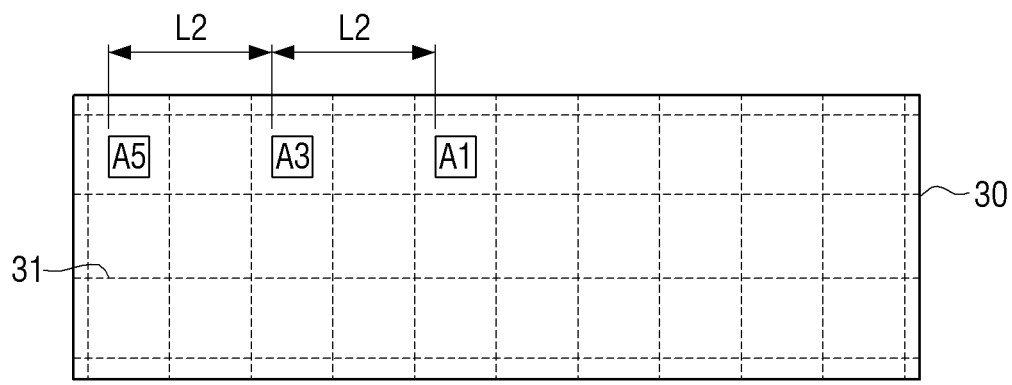
FIG. 6A is a top surface view of a relay substrate illustrating a process of transferring a plurality of micro LEDs on a relay substrate according to an embodiment.

Referring to FIG. 6A, the relay substrate 30 may have a pattern 31 for the plurality of micro LEDs 21 to be arranged on the relay substrate 30.

Here, the pattern 31 may be a circuit including an electric wire for supplying electric currents to the plurality of micro LEDs 21 transferred onto the relay substrate 30.

Accordingly, in case the plurality of micro LEDs 21 are transferred on the relay substrate 30, it may be identified integrally whether the plurality of micro LEDs 21 are operating on the relay substrate 30.

Subsequently, any defective micro LEDs or micro LEDs with lower performance than a predetermined performance, may be removed and replaced with new micro LEDs, and accordingly, the plurality of micro LEDs 21 transferred on the relay substrate 30 may be corrected.

In addition, when the plurality of micro LEDs 21 need to be corrected after being directly transferred onto the target substrate 80 from the first substrate 20, there may be impact applied to surrounding micro LEDs in the process of replacing defective micro LEDs arranged on the target substrate 80, and electric contact between the target substrate and the micro LEDs may be impacted.

Accordingly, when the plurality of micro LEDs 21 are corrected while being transferred onto the relay substrate 30, even if electric contact between the relay substrate 30 and the micro LEDs is impacted, stable electric contact between the target substrate 80 and the plurality of micro LEDs may be implemented through realignment and rearrangement in the process of transferring the plurality of micro LEDs on the relay substrate 30 to the target substrate 80.

Accordingly, by using the relay substrate 30 as an intermediate step, instead of directly transferring the micro LEDs from the first substrate 20 to the target substrate 80, stability and reliability of the transferring process of the plurality of micro LEDs 21 may be improved.

Also, by improving reliability of the process with respect to the target substrate 80 applied to a product, manufacturing efficiency may be improved and manufacturing cost may be reduced.

Referring back to FIG. 1, the stage 40 is a component in which the first substrate 20 and the relay substrate 30 may be loaded and unloaded, and it may be formed as a flat plate. Also, the stage 40 may move relatively with respect to the transfer part 10.

Hereinafter, the memory 50 and the processor 60 will be described in detail with reference to FIG. 3.

Figure 3:
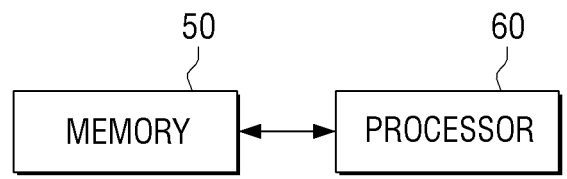
FIG. 3 is a block diagram illustrating a memory and a processor according to an embodiment.

FIG. 3 is a block diagram illustrating the memory 50 and the processor 60.

The memory 50 may be included in the micro LED transfer device 1. In addition, the memory 50 may be implemented as at least one of a flash memory type memory, a ROM, a RAM, a hard disk type memory, a multimedia card micro type memory, or a card type memory (e.g., an SD or XD memory, etc.).

Also, as illustrated in FIG. 3, the memory 50 may be connected to the processor 60, and may transmit and receive signals and information with the processor 60. The memory 50 may store input or characteristic information of the plurality of micro LEDs 21 and may transmit the stored characteristic information to the processor 60.

The processor 60 may be included in the micro LED transfer device 1, and may control the overall operations of the micro LED transfer device 1. In addition, the processor 60 may perform the function of controlling the overall operations of the micro LED transfer device 1.

That is, the processor 60 may be connected with the transfer part 10, the transcription part 11, the moving part 12, and the stage 40, and may control each of the components.

For example, the processor 60 may control the moving part 12, and move the moving part 12 from the first substrate 20 to the relay substrate 30. Also, the processor 60 may control the transcription part 11, and transfer the plurality of micro LEDs 21 on the relay substrate 30, and move the stage 40.

However, the disclosure is not limited to controlling all components by one processor 60, but each component may be controlled by a plurality of processors.

Here, the processor 60 may include one or more of a central processing unit (CPU), a controller, an application processor (AP) or a communication processor (CP), or an ARM processor.

Also, the processor 60 may be connected to the memory 50, and may use characteristic information of the plurality of micro LEDs 21 stored in the memory 50. Specific functions of the processor 60 according to an embodiment of the disclosure will be described later.

Hereinafter, a transferring process of the plurality of micro LEDs 21 using the processor 60 will be described in detail with reference to FIGS. 4 to 6B. In addition, the transferring process will be described mainly focused on using a stamp method, but as described above, the transferring process may be applied identically to a laser lift-off method.

Figure 4:
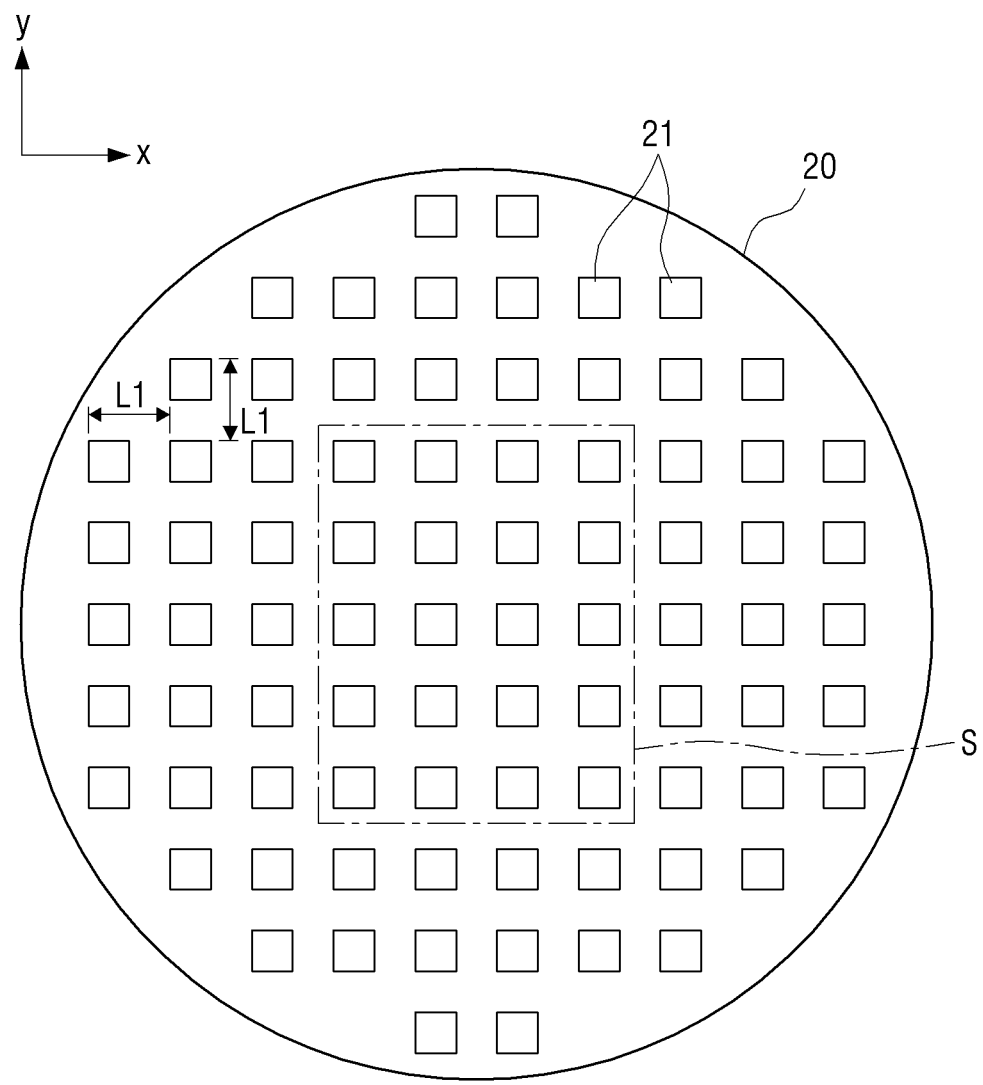
FIG. 4 is a top surface view of a first substrate according to an embodiment.
Figure 6B:
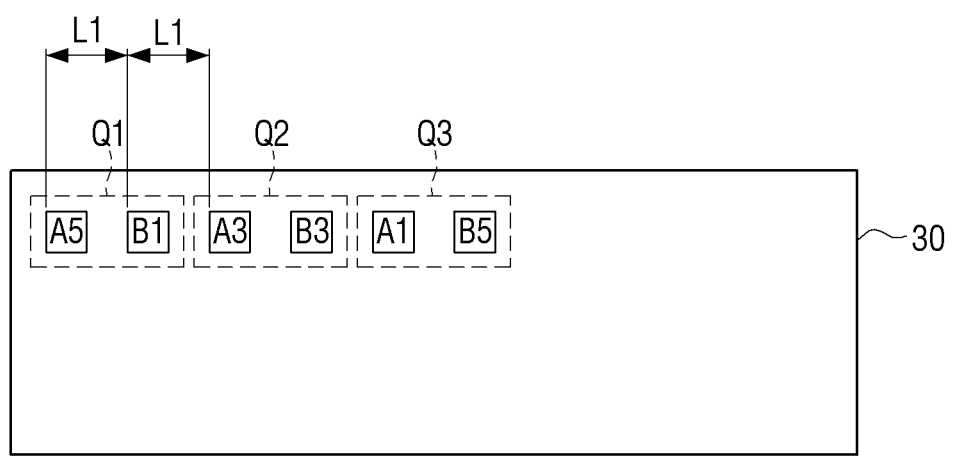
FIG. 6B is a top surface view of a relay substrate illustrating a process of transferring a plurality of micro LEDs according to an embodiment.

FIG. 4 is a top surface view illustrating the first substrate 20. FIG. 5 is a top surface view illustrating a state in which characteristic information of the plurality of micro LEDs 21 has been input. FIGS. 6A and 6B are top surface views of the relay substrate 30 illustrating a process in which the plurality of micro LEDs 21 are transferred onto the relay substrate 30.

As illustrated in FIG. 4, on the first substrate 20, the plurality of micro LEDs 21 may be arranged at a first interval L1. The number of the plurality of micro LEDs 21 arranged on the first substrate 20 is illustrated only for the convenience of explanation, and the micro LEDs are not limited to the number and size formed in FIG. 4.

Because of the manufacture tolerance in the manufacturing process of the plurality of micro LEDs 21, the characteristic of a specific area S on the first substrate 20 may be better than the other areas. Specifically, the characteristic of a micro LED located in a specific area S on the first substrate 20 may be better than the characteristics of the plurality of micro LEDs 21 located in areas other than the specific area S of the first substrate 20.

Here, the characteristics of the plurality of micro LEDs 21 may be at least one of an output wavelength, luminance, and a performance level.

Specifically, an output wavelength is related to the color that is emitted and expressed by the micro LED 21, and according to the output wavelength, the color expressed by the micro LED 21 may differ.

For example, in case the micro LED 21 emits light in a wavelength range of approximately between 630 nm and 780 nm, a red color may be expressed, and in case the micro LED 21 emits light in a wavelength range of approximately between 520 nm and 570 nm, a green color may be expressed, and in case the micro LED 21 emits light in a wavelength range of approximately between 420 nm and 480 nm, a blue color may be expressed.

More specifically, in case a micro LED emitting a green light in a wavelength range of approximately between 520 nm and 570 nm is arranged on the first substrate 20, a wavelength range close to approximately 520 nm may express a bluish green color, and a wavelength range close to approximately 570 nm may express a yellowish green color.

Accordingly, the characteristic of the micro LED 21 may vary according to the output wavelength emitted by the micro LED 21.

Also, luminance indicates brightness of a light source having a specific range, and according to the luminance of the plurality of micro LEDs 21 arranged on the first substrate 20, brightness expressed by the plurality of micro LEDs 21 may vary.

In addition, a performance level classifies output wavelengths or luminance according to specific standards, and the specific standards may vary depending on the needs of users.

For example, in case a performance level is based on output wavelengths, as a wavelength is closer to a wavelength range of a specific standard, the performance level may be set at a higher level, and as a wavelength is further away from a wavelength range of a specific standard, the performance level may be set at a lower level.

Also, in case a performance level is based on luminance, as the luminance is higher, the performance level may be set at a higher level, and as the luminance is lower, the performance level may be set at a lower level.

In addition, for a performance level, both of output wavelengths and luminance may be considered according to standards of users. For example, a performance level may be set while placing a value of U/100 on the output wavelength (here, U is a rational number in an amount of equal to or smaller than 100), and placing a value of (100−U)/100 on luminance according to the characteristic that a user intends to implement on the micro LED 21.

Referring to FIG. 5, the characteristics of the plurality of micro LEDs 21 may be measured by using an external measuring device with respect to the plurality of micro LEDs 21 arranged on the first substrate 20. Accordingly, the measured characteristic information may be stored in the memory 50.

As illustrated in FIG. 5, the processor 60 may determine a performance level for each of the plurality of micro LEDs 21 arranged on the first substrate 20, by using the characteristic information stored in the memory 50.

Also, the processor 60 may divide the first substrate 20 into a plurality of areas A, B, C, D based on the characteristic information stored in the memory 50 and the determined performance levels.

For example, a micro LED having a performance of a first level in the A area of the first substrate 20 may be referred to as an A1-micro LED, and a chip having a performance of a fifth level in the A area may be referred to as an A5-micro LED.

Likewise, a chip having a performance of a first level in the B area of the first substrate 20 may be referred to as a B1-micro LED, and a chip having a performance of a fifth level in the B area may be referred to as a B5-micro LED.

In addition, the processor 60 may divide the relay substrate 30 into a plurality of areas Q1 to Q5 (refer to FIG. 8B), and determine the arrangement locations of each of the plurality of micro LEDs 21, such that the output characteristics among the plurality of areas Q1 to Q5 constituting the relay substrate 30 are uniform.

Here, the arrangement locations may mean the destination locations where the plurality of micro LEDs 21 are to be arranged on the relay substrate 30, and the arrangement in which the plurality of micro LEDs 21 may be re-arranged.

Specifically, the processor 60 may divide each of the first substrate 20 and the relay substrate 30 into a plurality of areas (A, B, C, D of the first substrate and Q1 to Q5 of the relay substrate), and determine the arrangement locations of each of the plurality of micro LEDs 21 such that the output characteristics among the plurality of areas Q1 to Q5 constituting the relay substrate 30 are uniform, and the plurality of micro LEDs in the different areas (A, B, C, D) of the first substrate 20 are arranged in one area (e.g., Q1 to Q5) of the relay substrate 30.

For example, referring to FIG. 6B, arrangement positions of the plurality of micro LEDs 21 where the average value of the performance levels of the A5-micro LED and the B1-micro LED included in the first area Q1 on the relay substrate 30 is 3, the average value of the performance levels of the A3-micro LED and the B3-micro LED included in the second area Q2 is 3, and the average value of the performance levels of the A1-micro LED and the B5-micro LED included in the third area Q3 is 3 may be determined.

Here, output characteristics may fall under one of output wavelengths, luminance, and performance levels constituting characteristic information.

In addition, the processor 60 may additionally determine a second interval L2 that makes the average values of the output characteristics or performance levels among the specific areas Q1 to Q3 on the relay substrate 30 uniform, based on the characteristic information stored in the memory 50 of the A1 to A5 micro LEDs in the A area, and the B1 to B5 micro LEDs in the B area.

Here, the second interval L2 may be greater than the first interval L1 which is the interval among the plurality of micro LEDs 21 arranged on the first substrate 20, and may be greater than the first interval L1 in integral times.

Accordingly, the processor 60 may determine the arrangement locations of the plurality of micro LEDs 21 to be arranged on the relay substrate 30 and the second interval L2, based on the characteristic information of the plurality of micro LEDs 21 on the first substrate 20.

Accordingly, for implementing the standard deviation and the average value as the micro LEDs are transferred onto the relay substrate 30 as in FIG. 6B, the transcription part 11 may pick up the plurality of micro LEDs at the second interval L2 which is two times greater than the first interval L1 of the plurality of micro LEDs 21 on the first substrate 20, and transfer the LEDs onto the relay substrate 30 accordingly.

Also, the processor 60 may determine the second interval L2 which makes the output characteristics or the standard deviation of the performance levels uniform among the specific areas Q1 to Q5 on the relay substrate 30 at a predetermined range.

For example, based on the characteristic information of the plurality of micro LEDs 21 arranged on the first substrate 20, the processor 60 may execute simulation on the arrangement on the relay substrate 30 according to the second interval L2.

Specifically, the processor 60 may determine random arrangement locations and the second interval L2 with respect to the performance levels of the plurality of micro LEDs 21 included in the specific areas Q1 to Q5 of the relay substrate 30, and calculate a standard deviation of the performance levels of the plurality of micro LEDs 21 included in the specific areas Q1 to Q5 of the relay substrate 30, which is calculated based on the determined arrangement locations and the second interval L2.

Here, if the calculated standard deviation is within a set range, the plurality of micro LEDs 21 of the first substrate 20 may be transferred onto the relay substrate 30 in accordance with the calculated standard deviation.

Alternatively, if the calculated standard deviation exceeds a set range, the processor 60 may calculate a standard deviation of the performance levels of the plurality of micro LEDs 21 included in the new specific areas Q1 to Q5 based on new arrangement locations and a new second interval L2, and repeat calculation until a standard deviation is within the set range.

Here, the specific areas Q1 to Q5 are random areas and may have various forms, ranges, and width according to users' choices.

Also, the average values and the standard deviation among the specific areas Q1 to Q5 were suggested as an example for determining whether the performance levels of the plurality of micro LEDs 21 mounted on the relay substrate 30 have uniform distribution.

Accordingly, for determining whether the performance levels of the plurality of micro LEDs 21 have uniform distribution, not only the average values and the standard deviation of the specific areas Q1 to Q5, but also various measurement calculation methods of distribution may be used, such as dispersion in statistics, the degree of scattering, and etc.

In addition, the disclosure is not limited to evaluating the performance levels of the micro LEDs 21 included in a specific area, but a sample of a plurality of micro LEDs included in a specific area may be calculated, and the distribution of each performance level may be determined accordingly.

For example, distribution may be determined based on various samples such as the average value of the maximum value and the minimum value, the median value, and etc., among the performance levels of a plurality of micro LEDs included in a specific area depending on the needs, the degree of overload, the time for calculation, and etc.

The processor 60 may determine the second interval L2 among the plurality of micro LEDs 21 to be simultaneously picked up, and cause the plurality of micro LEDs 21 to be simultaneously picked up based on the determined second interval L2 by controlling the transcription part 11.

That is, the transfer part 10 may simultaneously pick up the plurality of micro LEDs 21 on the first substrate 20 and arrange the picked up micro LEDs onto the relay substrate 30. The processor 60 may control the transfer part 10 such that the plurality of micro LEDs 21 spaced apart from one another among the plurality of micro LEDs 21 are arranged on the first substrate 21 as they are simultaneously picked up from the first substrate 20.

Accordingly, as the transfer part 10 simultaneously pick up the plurality of micro LEDs 21 and transfer them, transfer speed and transfer efficiency may be improved.

Also, the processor 60 may control the transfer part such that the plurality of micro LEDs in different areas of the first substrate 20 are alternatively arranged in one area of the relay substrate 30.

For example, as illustrated in FIGS. 5 and 6A, the transfer part 10 may transfer the A5-micro LED, the A3-micro LED, and the A1-micro LED in the A area of the first substrate 20 onto the relay substrate 30 in an alternating way.

Furthermore, the transfer part 10 may transfer the B1-micro LED, the B3-micro LED, and the B5-micro LED in the B area different from the A area of the first substrate 20 to areas Q1 to Q3 of the relay substrate 30 alternatively from A1-micro LED, A3-micro LED and A5-micro LED, respectively.

Accordingly, by selectively transferring necessary micro LEDs in various areas of the plurality of micro LEDs 21 having different performances on the first substrate 20 to the relay substrate 30, transfer efficiency may be improved, and by effectively using the plurality of micro LEDs 21, the manufacturing cost may be reduced.

Hereinafter, the process after transferring some micro LEDs to a relay substrate will be described with reference to FIGS. 7 to 8B.

Figure 7:
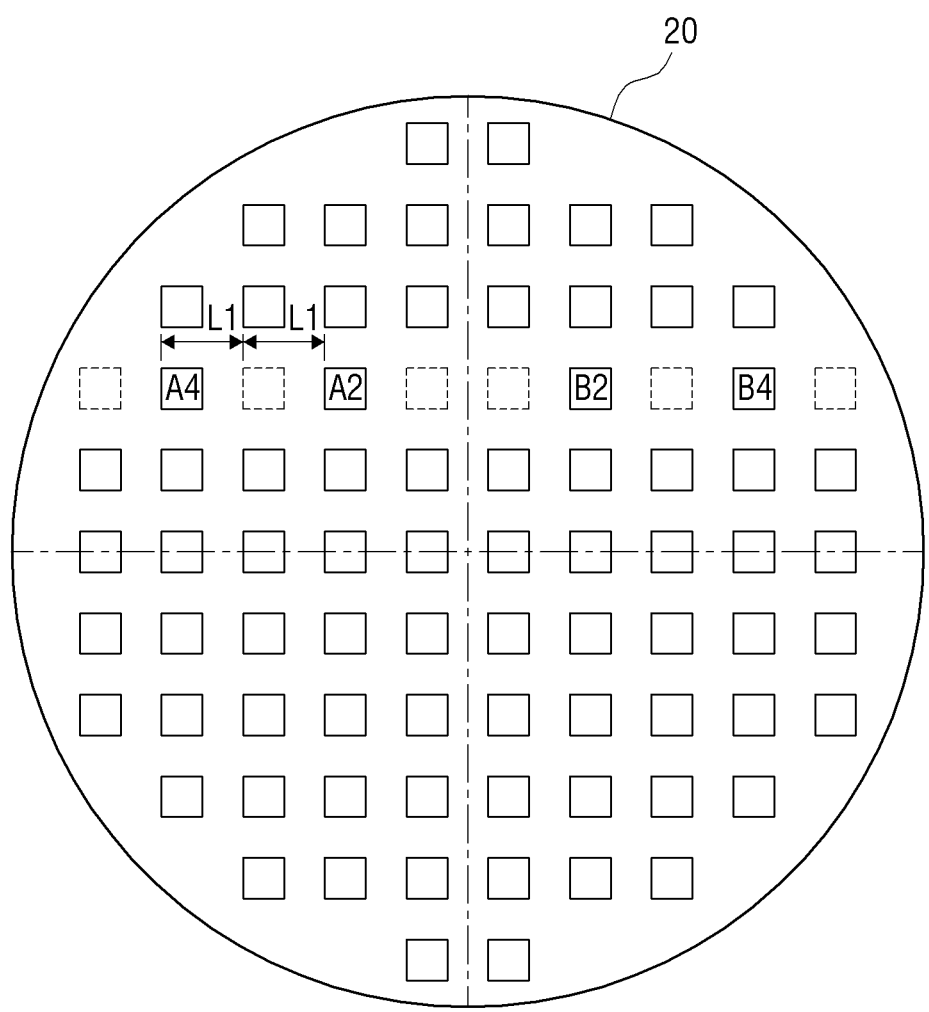
FIG. 7 is a top surface view of a first substrate after transferring some of a plurality of micro LEDs according to an embodiment.
Figure 8A:
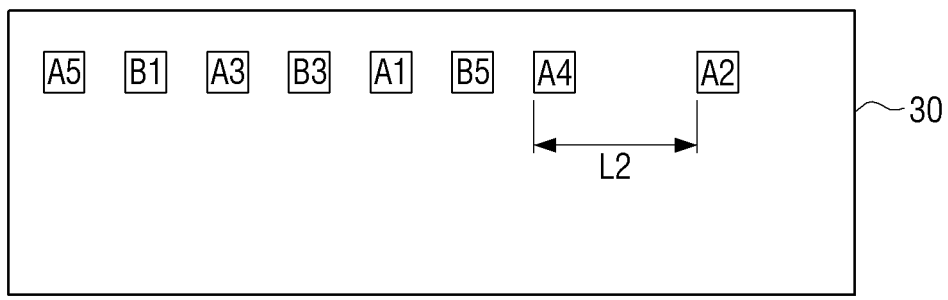
FIG. 8A is a top surface view of a relay substrate illustrating a process in which a plurality of additional micro LEDs are transferred onto a relay substrate according to an embodiment.
Figure 8B:
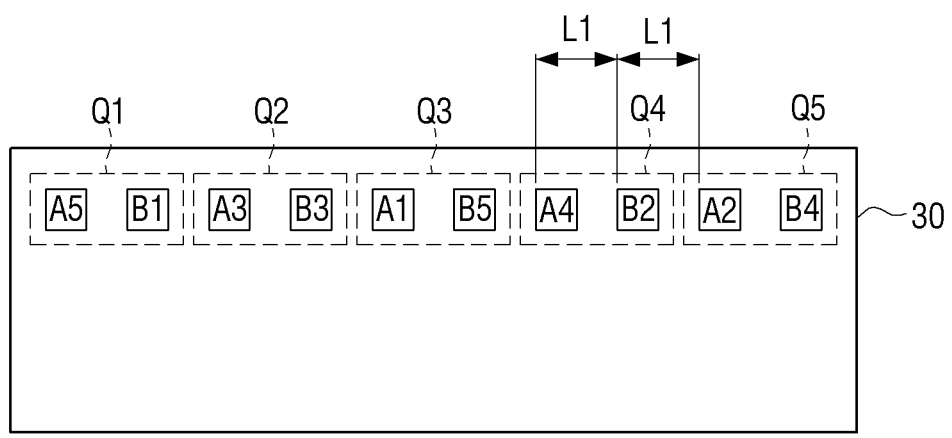
FIG. 8B is another top surface view of a relay substrate illustrating a process in which a plurality of additional micro LEDs are transferred onto a relay substrate according to an embodiment.

FIG. 7 is a top surface view of the first substrate 20 after some of a plurality of micro LEDs were transferred, and FIGS. 8A and 8B are top surface views of the relay substrate 30 illustrating a process in which a plurality of additional micro LEDs 21 are transferred onto the relay substrate 30.

As illustrated in FIG. 7, on the first substrate 20, a plurality of micro LEDs (A2-micro LED, A4-micro LED, B2-micro LED and B4-micro LED) may remain after the A5-micro LED, the B1-micro LED, the A3-micro LED, the B3-micro LED, the A1-micro LED, and the B5-micro LED are transferred to the relay substrate 30.

According to an embodiment, the relay substrate 30 may move in a horizontal direction on the stage 40. Accordingly, as illustrated in FIG. 8A, on the relay substrate 30, the A4-micro LED and the A2-micro LED which are the plurality of remaining micro LEDs in the first substrate 20 may be transferred to the relay substrate 30, and arranged in an area next to the previously moved micro LEDS, for example, A5-micro LED, B1-micro LED, A3-micro LED, B3-micro LED, A1-micro LED and B5-micro LED.

That is, as the relay substrate 30 moves the plurality of remaining micro LEDs may be arranged on the relay substrate 30 in different columns and rows from the areas where the A5-micro LED, the B1-micro LED, the A3-micro LED, the B3-micro LED, the A1-micro LED, and the B5-micro LED that were transferred and arranged.

Accordingly, by using all of the plurality of micro LEDs 21 arranged on the first substrate 20 without leaving them or throwing them away, the manufacturing cost may be reduced.

Referring to FIG. 8B, the B2-micro LED may be arranged between the A4-micro LED and the A2-micro LED, and the B4-micro LED may be arranged next to the A2-micro LED at the first interval L1, respectively.

Accordingly, the average values of the performance levels of specific areas Q4 to Q5 on the relay substrate 30 may be uniform, and the plurality of micro LEDs having different performance levels from one another may be distributed evenly.

In addition, the average values of the performance levels of each of the plurality of areas Q1 to Q5 of the relay substrate 30 may be identical, and thus uniform luminance or colors of the relay substrate 30 may be implemented.

In addition, the plurality of micro LEDs 21 having different characteristic information may be realigned on the relay substrate 30 such that the output characteristics may be uniform, and thus the manufactured first substrate 20 may be used effectively and the manufacturing cost may be reduced.

In addition, as the plurality of micro LEDs 21 are arranged on the relay substrate 30 so that the output characteristics are uniform, an image having uniform luminance and colors may be implemented.

Hereinafter, the correcting process of the plurality of micro LEDs 21 transferred onto the relay substrate 30 will be described with reference to FIGS. 9A to 9C.

Figure 9A:
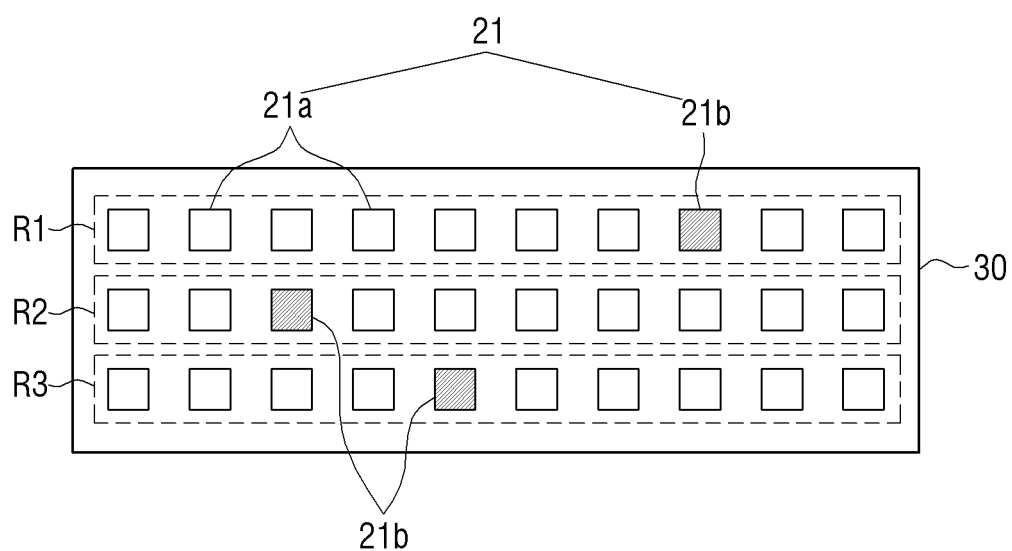
FIG. 9A is a top surface view of a relay substrate illustrating a process of correcting a relay substrate on which a plurality of micro LEDs have been transferred according to an embodiment.
Figure 9B:
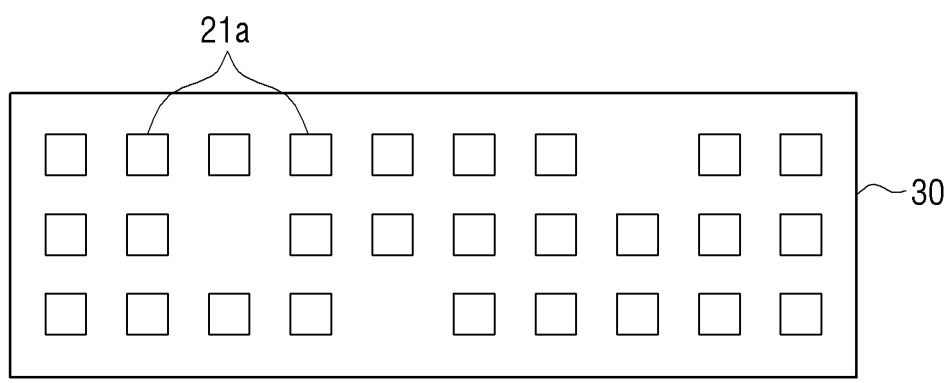
FIG. 9B is another top surface view of a relay substrate illustrating a process of correcting a relay substrate on which a plurality of micro LEDs have been transferred according to an embodiment.
Figure 9C:
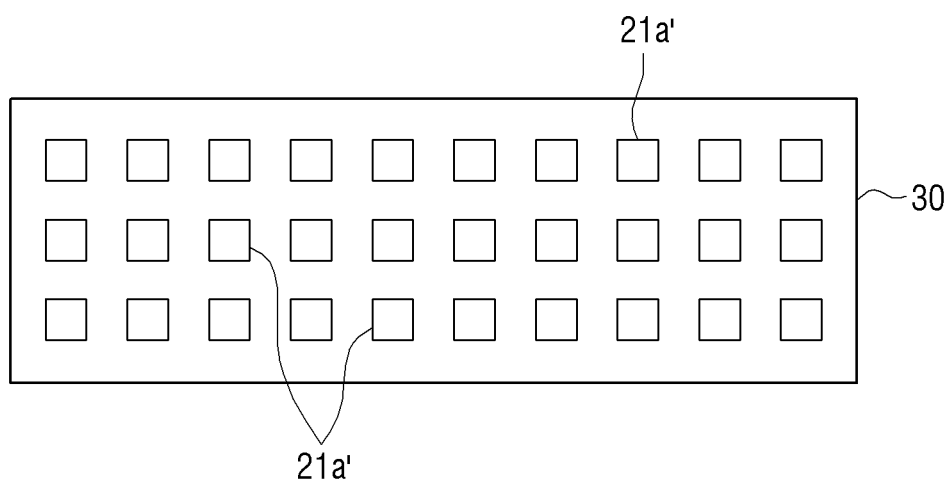
FIG. 9C is yet another top surface view of a relay substrate illustrating a process of correcting a relay substrate on which a plurality of micro LEDs have been transferred according to an embodiment.

FIGS. 9A, 9B and 9C are top surface views of the relay substrate 30 illustrating a process in which the plurality of micro LEDs 21 transferred onto the relay substrate 30 are corrected.

As illustrated in FIG. 9A, on the relay substrate 30, the plurality of micro LEDs 21 are arranged. Here, the plurality of micro LEDs 21 emitting different colors from one another along the longitudinal direction of the relay substrate 30 may be arranged.

For example, in a first row area R1 of the relay substrate 30, a first micro LED emitting red light may be arranged, and in a second row area R2, a second micro LED emitting green light may be arranged, and in a third row area R3, a third micro LED emitting blue light may be arranged.

Here, the plurality of micro LEDs included in each of the first to third row areas R1 to R3 may be arranged such that the output characteristics are uniform, that is, emitting light in the same color.

Specifically, the first row area R1 may be arranged so that the plurality of micro LEDs arranged in the first row area R1 only include the first micro LED emitting red light. Similarly, the second row area R2 may be arranged so that the plurality of micro LEDs arranged in the second row area R2 only include the second micro LED emitting green light. The third row area R3 may be arranged so that the plurality of micro LEDs arranged in the third row area R3 only include the third micro LED emitting blue light.

In addition, the first to third micro LEDs may be sequentially arranged on the relay substrate. For example, as illustrated in FIG. 9A, the first to third micro LEDs may be sequentially arranged in the column direction of the relay substrate 30.

Accordingly, the micro LED included in each row may be referred to as a sub pixel, and each column unit may be referred to as a pixel.

However, the first to third micro LEDs are not limited to being arranged in the column direction of the relay substrate 30, but may be sequentially arranged in various forms so as to constitute one pixel unit.

Meanwhile, the plurality of micro LEDs 21 may be electronically connected with the relay substrate 30, and the processor 60 may control the plurality of micro LEDs 21 to emit light by applying currents to the relay substrate 30.

Here, based on a predetermined value of a performance to be applied to a product, the processor 60 may identify the plurality of micro LEDs 21 as first group micro LEDs 21*a* having higher performances than a predetermined value and second group micro LEDs 21*b* having lower performances than the predetermined value.

As illustrated in FIGS. 9A and 9B, the processor 60 may remove the second group micro LEDs 21*b* having performances lower than the predetermined value from the relay substrate 30 through laser or various other methods.

Next, as illustrated in FIG. 9C, the processor 60 may transfer new micro LEDs 21*a*' having higher performances than the predetermined value in the locations where each of the second group micro LEDs 21*b* has been removed.

Accordingly, when the plurality of micro LEDs 21 are transferred onto the relay substrate 30, it may be identified integrally whether the plurality of micro LEDs 21 operate on the relay substrate 30, and the reliability of manufacture of the plurality of micro LEDs realigned to have uniform output characteristics may be improved.

Hereinafter, a relay substrate 30' according to another embodiment will be described with reference to FIG. 10.

Figure 10:
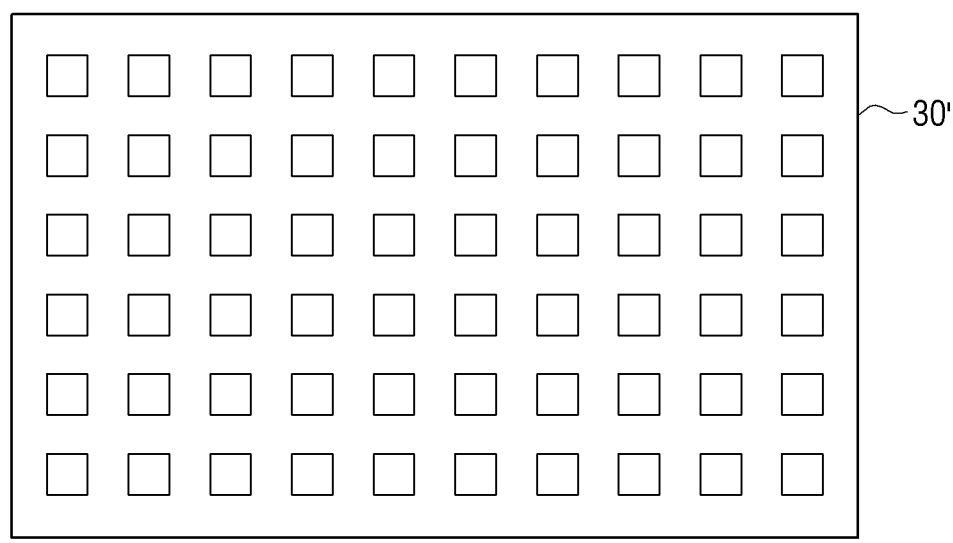
FIG. 10 is a top surface view illustrating a relay substrate according to an embodiment.

FIG. 10 is a top surface view illustrating a relay substrate 30' according to another embodiment.

Compared to FIGS. 9A to 9C, the relay substrate 30' in FIG. 10 is formed in a different size. However, the relay substrate may be formed in various sizes, and is not limited to the embodiments herein. For example, while the relay substrate 30 in FIGS. 9A to 9C includes a plurality of micro LEDs arranged in three rows, the relay substrate 30' illustrated in FIG. 10 includes a plurality of micro LEDs arranged in six rows.

Here, three rows or six rows are mentioned as an example for the convenience of explanation, and the arrangement of rows and columns, and the number of the plurality of micro LEDs 21 may vary.

Accordingly, the relay substrate 30' may be formed to have the same size as the target substrate applied to a product, and by simultaneously transferring the plurality of micro LEDs arranged on the relay substrate 30' such that the output characteristics are uniform on the target substrate, transfer speed may be improved, and the time for manufacturing may be shortened.

Hereinafter, a process in which the plurality of micro LEDs 21 arranged on the relay substrate 30 such that the output characteristics are uniform and a process of transferring the relay substrate 30 to the target substrate 80 will be described with reference to FIGS. 11A and 11B.

Figure 11A:
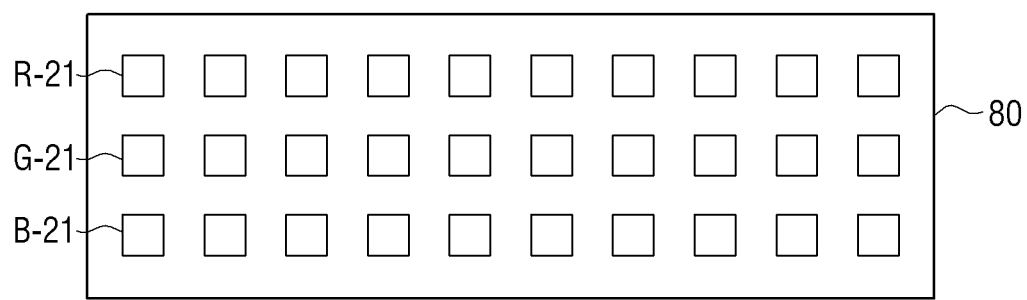
FIG. 11A is a top surface view of a target substrate in which a plurality of micro LEDs have been transferred to constitute pixels according to an embodiment.
Figure 11B:
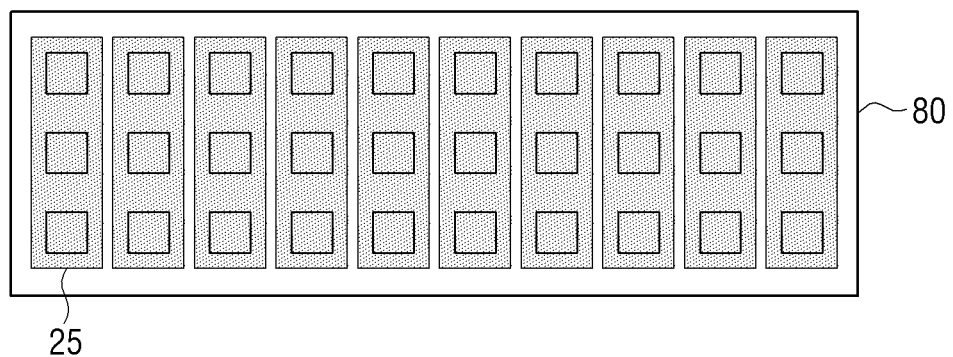
FIG. 11B is another top surface view of a target substrate in which a plurality of micro LEDs have been transferred to constitute pixels according to an embodiment.

FIGS. 11A and 11B are top surface views of the target substrate 80 illustrating a process in which the plurality of micro LEDs 21 transferred onto the target substrate 80 to constitute pixels.

As illustrated in FIG. 11A, the plurality of micro LEDs 21 on the relay substrate 30 that went through the correcting process illustrated in FIG. 9C may be transferred onto the target substrate 80 applied to a product.

Here, as methods for transferring the plurality of micro LEDs 21, various methods such as the aforementioned stamp method and laser lift-off method may be used.

The target substrate 80 is a device that may be electrically and/or physically connected to the plurality of micro LEDs 21 so as to control and operate the plurality of micro LEDs 21 to display an image, and may include a thin film transistor (TFT).

As illustrated in FIG. 11A, a first micro LED R-21 emitting red light, a second micro LED G-21 emitting green light, and a third micro LED B-21 emitting blue light may be arranged on the target substrate 80, respectively.

Each row of the first to third micro LEDs may constitute a sub pixel. In addition, in order for the first to third micro LEDs constitute one pixel, a molding part 25 may fix and pixelate each of the first to third micro LEDs formed, as illustrated in FIG. 11B.

Accordingly, as the plurality of micro LEDs 21 arranged such that the characteristic information is uniform among the plurality of micro LEDs and are transferred and arranged onto the target substrate 80 from the relay substrate 30, uniform luminance and colors of an image may be implemented.

In addition, considering that one pixel is a structure that is fixed by the molding part 25, it may be difficult to replace or correct micro LEDs if it is found that any one of the plurality of micro LEDs do not perform at a required level or found defective, once the micro LEDs are fixed or pixelated.

Also, if the correction needs to be performed on the target substrate 80, damages may occur to the target substrate 80 or surrounding micro LEDs in the process of removing micro LEDs, so it may be preferable and more stable to correct the plurality of micro LEDs 21 arranged on the relay substrate 30 during the manufacturing process.

Hereinafter, a micro LED transferring method of the plurality of micro LEDs 21 by using the micro LED transfer device 1 will be described in detail with reference to FIG. 12.

Figure 12:
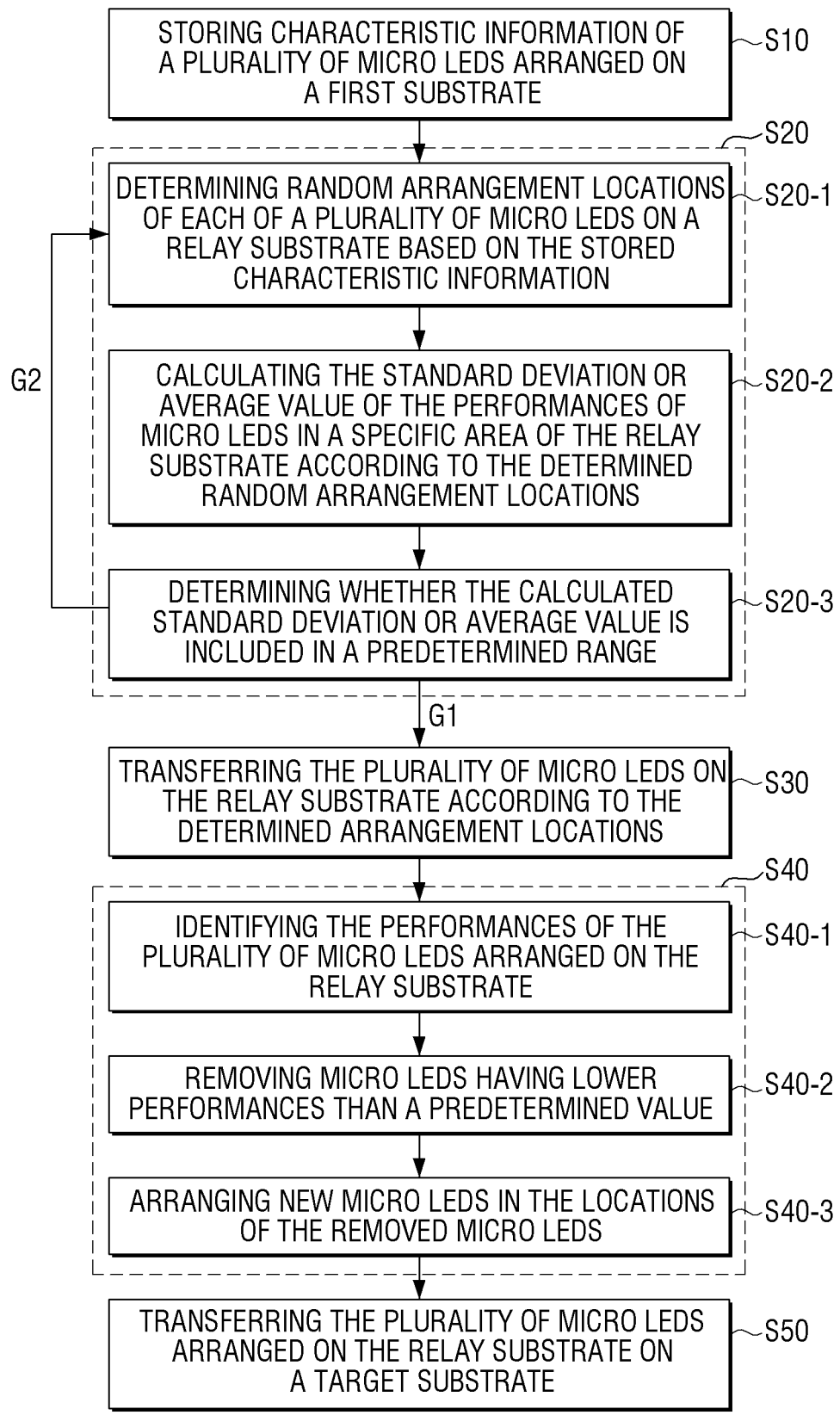
FIG. 12 is a flowchart illustrating a micro LED transferring method according to an embodiment.

FIG. 12 is a flowchart illustrating a micro LED transferring method according to an embodiment.

In step S10, the characteristic information of the plurality of micro LEDs 21 arranged on the first substrate 20 may be stored in the memory 50.

In step S20, the processor 60 may determine the arrangement locations of each of the plurality of micro LEDs 21 on the relay substrate 30 based on the characteristic information stored in the memory 50. Here, in determining the arrangement locations, the processor 60 may execute simulation for determining the arrangement locations and indicating whether the characteristics are within a predetermined range.

Specifically, in step S20-1, based on the stored characteristic information, the processor 60 may determine random arrangement locations of each of the plurality of micro LEDs 21 on the relay substrate 30.

In step S20-2, the processor 60 may calculate the standard deviation or the average value of the performance of the micro LEDs in a specific area on the relay substrate 30 according to the determined random arrangement locations in step S20-1.

In step S20-3, the processor 60 may determine whether the calculated standard deviation or average value is within a predetermined range.

Here, in case the calculated standard deviation and average value are within a predetermined range set by the user, the transferring step S30 may proceed according to a G1 route.

Alternatively, in case the calculated standard deviation and average value exceed a predetermined range set by the user, the processor 60 may determine new arrangement locations on the relay substrate 30 based on the characteristic information stored in the memory 50, and proceed to a G2 route.

Also, when the processor 60 determines new random arrangement locations, the processor 60 may make a determination with reference to the result of simulation with respect to the arrangement locations calculated previously.

In step S30, the plurality of micro LEDs 21 may be transferred onto the relay substrate 30 according to the determined arrangement locations.

Here, as described above, methods for transferring may include various methods, such as a stamp method, a laser lift-off method, and etc.

In step S40, correction of the plurality of micro LEDs 21 arranged on the relay substrate 30 may be performed.

Specifically, the performances of the plurality of micro LEDs 21 arranged on the relay substrate 30 are identified in step S40-1.

Subsequently, micro LEDs 21b having lower performances than a predetermined value may be removed. Here, methods for removing micro LEDs 21b having lower performances than a predetermined value may include various methods, such as a laser method and etc.

In step S40-3, new micro LEDs 21a may be arranged in the locations of the removed micro LEDs.

Lastly, in step S50, the plurality of micro LEDs 21 arranged on the relay substrate 30 that went through the correcting step S40 may be transferred onto the target substrate 80.

The methods according to the aforementioned various embodiments may be implemented in the forms of applications that may be installed on conventional micro LED transfer devices.

Also, methods according to the aforementioned various embodiments may be implemented only with software upgrade, or hardware upgrade of conventional micro LED transfer devices.

In addition, the aforementioned various embodiments may be performed through an embedded server provided on a micro LED transfer device, or an external server of a micro LED transfer device.

The aforementioned various embodiments may be implemented in a recording medium that may be read by a computer or a device similar to a computer, by using software, hardware, or a combination thereof. In some cases, the embodiments described herein may be implemented on a processor. According to implementation by software, the embodiments such as procedures and functions described herein may be implemented as separate software modules. Each of the software modules may perform one or more functions and operations described herein.

Furthermore, computer instructions for performing processing operations of the micro LED transfer device 1 according to the aforementioned various embodiments may be stored in a non-transitory computer-readable medium. When computer instructions stored in such a non-transitory computer-readable medium are executed by the processor of a specific device, processing operations at the micro LED transfer device 1 according to the aforementioned various embodiments may be performed by the specific device.

A non-transitory computer-readable medium may refer to a medium that stores data semi-permanently, and may be readable by machines. As specific examples of a non-transitory computer-readable medium, the non-transitory computer-readable medium may include a CD, a DVD, a hard disc, a blue-ray disc, a USB, a memory card, a ROM and the like.

Also, while the various embodiments have been described separately from one another, each embodiment does not have to be implemented independently, but the configuration and operation of each embodiment may be implemented in combination thereof.

In addition, while embodiments have been shown and described, the embodiments herein are not limited to the aforementioned specific embodiments, and it is apparent that various modifications may be made by those having ordinary skill in the technical field to which the disclosure belongs, without departing from the gist of the disclosure.

What is claimed is:

1. A light emitting diode (LED) transfer device comprising:
   a transfer part configured to transfer a plurality of LEDs arranged on a first substrate to a relay substrate;
   a memory configured to store characteristic information of each of the plurality of LEDs; and
   a processor configured to:
      determine arrangement locations of each of the plurality of LEDs on the relay substrate based on the stored characteristic information, and
      control the transfer part to transfer the plurality of LEDs to the determined arrangement locations,
   wherein the processor is further configured to:
      divide the relay substrate into a plurality of second areas, and
      determine the arrangement locations of each of the plurality of LEDs on the relay substrate such that output characteristics of the plurality of second areas are uniform, based on the stored characteristic information.

2. The LED transfer device of claim 1, wherein the relay substrate has a size that is different from a size of the first substrate.

3. The LED transfer device of claim 1, wherein the plurality of LEDs are arranged in a pattern on the relay substrate.

4. The LED transfer device of claim 1, wherein the plurality of LEDs include a first LED emitting red light, a second LED emitting green light, and a third LED emitting blue light, and
   wherein the first LED, the second LED, and the third LED are sequentially arranged on the relay substrate.

5. The LED transfer device of claim 1, wherein the processor is further configured to:
   divide the first substrate a plurality of first areas, and
   arrange the plurality of LEDs in the plurality of first areas of the first substrate into one of the plurality of second areas of the relay substrate.

6. The LED transfer device of claim 5, wherein the processor is further configured to control the transfer part so that the plurality of LEDs in the plurality of first areas of the first substrate are alternatively arranged in the one of the plurality of second areas of the relay substrate.

7. The LED transfer device of claim 1, wherein the transfer part is configured to simultaneously collect the plurality of LEDs on the first substrate and arrange the collected plurality of LEDs on the relay substrate, and
   wherein the processor is further configured to control the transfer part so that the plurality of LEDs spaced apart from one another on the first substrate are simultaneously collected.

8. The LED transfer device of claim 1, wherein the transfer part comprises a mask device having openings formed in locations corresponding to the determined arrangement locations of the plurality of LEDs on the first substrate, and
   wherein the processor is further configured to control a light source to irradiate laser light on the mask device and control the mask device to transfer the plurality of LEDs on the relay substrate.

9. The LED transfer device of claim 1, wherein the characteristic information is at least one of output wavelengths, luminance, and performance levels of the plurality of LEDs.

10. The LED transfer device of claim 1, wherein the relay substrate is provided on a stage and is moveable in a horizontal direction.

* * * * *